US010411063B2

United States Patent
Yang et al.

(10) Patent No.: US 10,411,063 B2
(45) Date of Patent: Sep. 10, 2019

(54) SINGLE-EXPOSURE HIGH DYNAMIC RANGE SENSOR

(71) Applicant: OMNIVISION TECHNOLOGIES, INC., Santa Clara, CA (US)

(72) Inventors: Dajiang Yang, San Jose, CA (US); Oray Orkun Cellek, Santa Cruz, CA (US); Duli Mao, Sunnyvale, CA (US); Xianfu Cheng, Sunnyvale, CA (US); Xin Wang, San Jose, CA (US); Bill Phan, San Jose, CA (US); Dyson Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 95 days.

(21) Appl. No.: 15/628,304

(22) Filed: Jun. 20, 2017

(65) Prior Publication Data

US 2018/0366513 A1    Dec. 20, 2018

(51) Int. Cl.
| | |
|---|---|
| H01L 27/00 | (2006.01) |
| H01L 27/148 | (2006.01) |
| H01L 27/146 | (2006.01) |
| H04N 5/378 | (2011.01) |
| H04N 5/355 | (2011.01) |
| H04N 5/3745 | (2011.01) |

(52) U.S. Cl.
CPC .. *H01L 27/14831* (2013.01); *H01L 27/14621* (2013.01); *H01L 27/14868* (2013.01); *H04N 5/3559* (2013.01); *H04N 5/35563* (2013.01); *H04N 5/378* (2013.01); *H04N 5/37452* (2013.01); *H04N 5/37457* (2013.01)

(58) Field of Classification Search
CPC ......... H01L 27/14612; H01L 27/14614; H01L 27/14625; H01L 27/14641
USPC .............................. 250/208.1, 214.1; 348/461
See application file for complete search history.

(56) References Cited

U.S. PATENT DOCUMENTS

| | | | | |
|---|---|---|---|---|
| 10,044,960 B2* | 8/2018 | Mao | ................... | H01L 27/14612 |
| 2014/0246561 A1* | 9/2014 | Chen | ................... | H01L 27/14812 |
| | | | | 250/208.1 |
| 2015/0333099 A1* | 11/2015 | Lyu | ................... | H01L 27/14647 |
| | | | | 257/432 |

* cited by examiner

*Primary Examiner* — Kevin K Pyo
(74) *Attorney, Agent, or Firm* — Christensen O'Connor Johnson Kindness PLLC

(57) ABSTRACT

A single-exposure high dynamic range (HDR) image sensor includes a first photodiode and a second photodiode, with a smaller full-well capacity than the first photodiode, disposed in a semiconductor material. The image sensor also includes a first floating diffusion disposed in the semiconductor material and a first transfer gate coupled to the first photodiode to transfer first image charge accumulated in the first photodiode into the first floating diffusion. A second floating diffusion is disposed in the semiconductor material and a second transfer gate is coupled to the second photodiode to transfer second image charge accumulated in the second photodiode into the second floating diffusion. An attenuation layer is disposed between the second photodiode and image light directed towards the single-exposure HDR image sensor to block a portion of the image light from reaching the second photodiode.

20 Claims, 3 Drawing Sheets

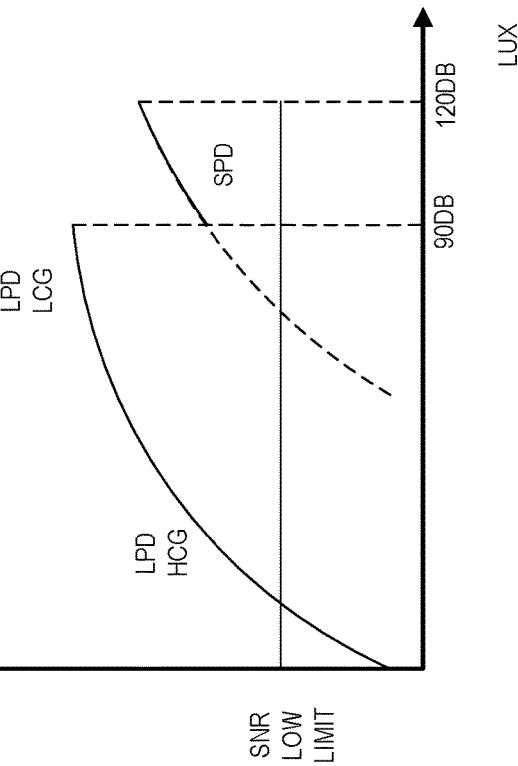
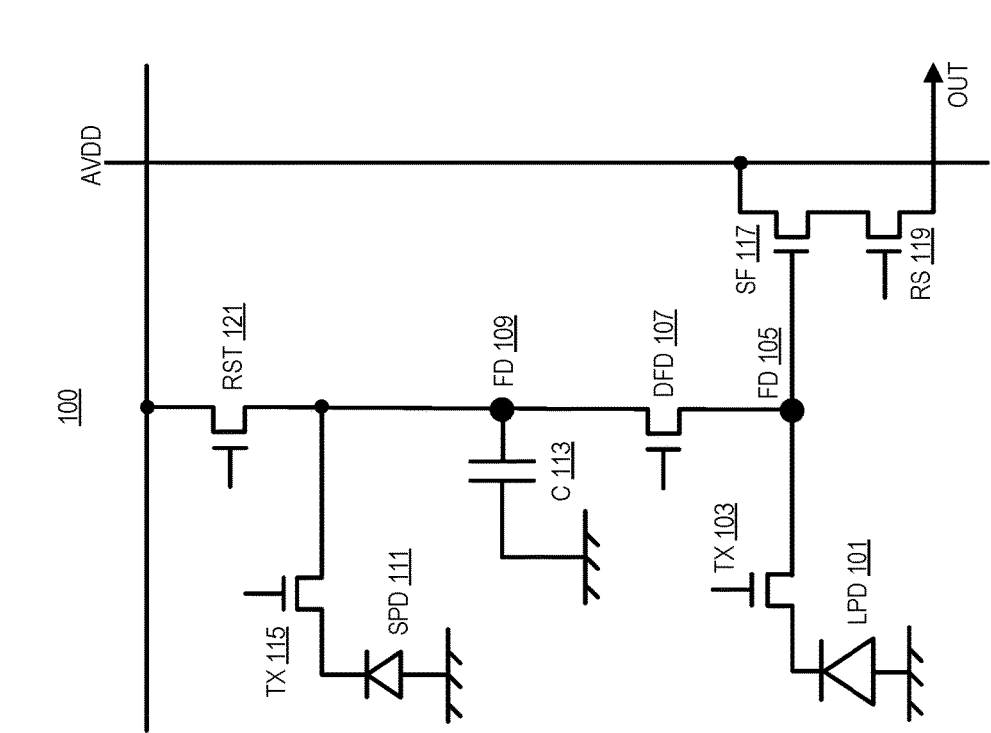
FIG. 1B
FIG. 1A

SINGLE-EXPOSURE HIGH DYNAMIC RANGE SENSOR

TECHNICAL FIELD

This disclosure relates generally to semiconductor fabrication, and in particular but not exclusively, relates to CMOS image sensors.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

High dynamic range (HDR) image sensors have become important to many fields of technology including the automotive industry. Some HDR image sensors may use multiple exposures to achieve higher dynamic range. However, this can impart problems such as motion artifacts, and imaged LEDs appearing as though they are flickering.

BRIEF DESCRIPTION OF THE DRAWINGS

Non-limiting and non-exhaustive examples of the invention are described with reference to the following figures, wherein like reference numerals refer to like parts throughout the various views unless otherwise specified.

FIG. 1A illustrates at least part of a single-exposure high dynamic range (HDR) image sensor pixel, in accordance with the teachings of the present disclosure.

FIG. 1B illustrates a signal to noise ratio (SNR) vs. luminance (LUX) output graph of the image sensor pixel of FIG. 1A, in accordance with the teachings of the present disclosure.

Figure 2A:
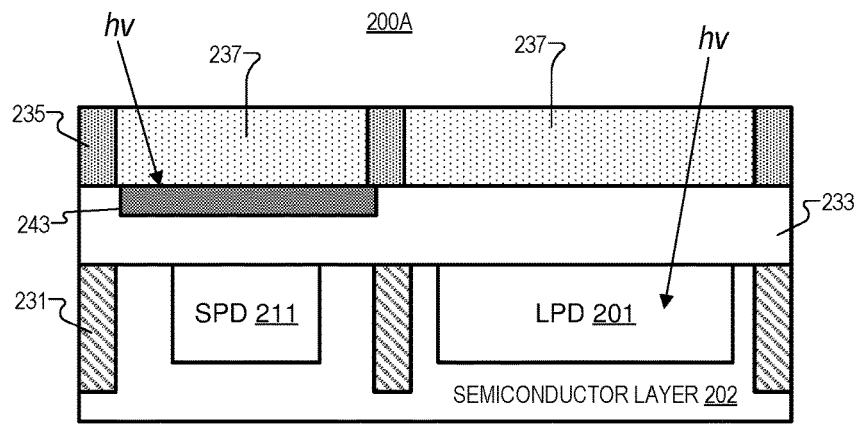
FIGS. 2A-2C illustrate various examples of attenuation layers for a small photodiode, in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus relating to a signal-exposure high dynamic range sensor are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

FIG. 1A illustrates at least part of a single-exposure high dynamic range (HDR) image sensor pixel 100. Single-exposure HDR image sensor pixel 100 includes first (large) photodiode 101, transfer gate 103, first floating diffusion 105, source follower (amplifier) transistor 117, row select transistor 119, dual floating diffusion gate 107, second floating diffusion 109, capacitor 113, second (small) photodiode 111, second transfer gate 115, and reset transistor 121.

As illustrated, first photodiode 101 is disposed in a semiconductor material (see e.g., FIG. 2A-2C semiconductor layer 202), and second photodiode 111 (having a smaller full-well capacity than first photodiode 101) is also disposed in the semiconductor material. First floating diffusion 105 is disposed in the semiconductor material proximate to first photodiode 101, and first transfer gate 103 is coupled to first photodiode 101 to transfer first image charge accumulated in first photodiode 101 into first floating diffusion 105 in response to a first transfer signal applied to first transfer gate 103. Second floating diffusion 109 is disposed in the semiconductor material proximate to second photodiode 111, and second transfer gate 115 is coupled to the second photodiode 111 to transfer second image charge accumulated in second photodiode 111 into second floating diffusion 109 in response to a second transfer signal applied to second transfer gate 115. Although depicted elsewhere (see e.g., FIGS. 2A-2C), an attenuation layer is disposed between second photodiode 111 and image light directed towards single-exposure HDR image sensor 100 to block a portion of the image light from reaching second photodiode 111.

As shown, second floating diffusion 109 is coupled to capacitor 113 to store the first image charge transferred from first photodiode 101 when a transfer signal is applied to dual floating diffusion gate 107. Similarly, to read the second image charge generated in second photodiode 111, dual floating diffusion gate 107 (which is disposed between first floating diffusion 105 and second floating diffusion 109) may transfer image charge from second floating diffusion 109 to first floating diffusion 105 in response to a transfer signal applied to dual floating diffusion gate 107. Capacitor 113 selectively stores first and second image charge transferred out of first photodiode 101 and second photodiode 111, respectively. Capacitor 113 may be constructed using a large floating diffusion, parallel plates (e.g., metal-insulator-metal configuration), doped semiconductor layers formed in proximity to one another, or the like. One of ordinary skill in the art having the benefit of the present disclosure will appreciate there are many structures that can be used to form capacitor 113, in accordance with the teachings of the present disclosure.

As illustrated, an amplifier (source follower 117) is coupled to first floating diffusion 105 to amplify a charge on the first floating diffusion, and row select transistor 119 is coupled to the amplifier. This portion of readout circuitry amplifies the signal on first floating diffusion 105 for it to be read out to form an image. Also, reset transistor 121 is coupled to first floating diffusion 105 and second floating diffusion 109 to reset image charge in first floating diffusion 105 (when dual floating diffusion gate 107 is on), second floating diffusion 109, and capacitor 113.

In the depicted example, first (large) photodiode 101 may be used to capture low light conditions (since it has a larger full-well capacity—e.g., ~50-60 Ke⁻—than second photodiode 111, and since there is no attenuation layer positioned to block light from entering first photodiode 101). Moreover, first photodiode 101, both floating diffusions 105/109, and capacitor 113 may be used to capture a medium light condition (since excess charge from first floating diffusion 105 can flow into capacitor 113 and second floating diffusion 109 when a transfer signal is applied to dual floating diffusion gate 107). Second (small) photodiode 111 may be used to capture high-intensity light conditions since it has a smaller full well capacity—~12 Ke⁻—and an attenuation layer that prevents light from reaching the photodiode. This configuration allows single-exposure HDR image sensor 100 to achieve a dynamic range of at least 120 dB. This may be useful in automotive applications where image sensors should be capable of clearly imaging LEDs (without flickering) from street signs and the like.

FIG. 1B illustrates an example signal to noise ratio (SNR) vs. luminance (LUX) output graph of the image sensor pixel of FIG. 1A. As shown, the combination of first photodiode 101 and second photodiode 111 can be used to achieve a 120 dB luminance range. As illustrated first (large) photodiode (LPD) can be used to capture low light conditions with a higher conversion gain (HCG) and medium light conditions with a lower conversion gain (LCG). Then, to capture high light conditions, the second (small) photodiode (SPD) may be used to capture high intensity light conditions, and expand the dynamic range of the image sensor up to 120 dB. In other words, the first photodiode, in conjunction with the first floating diffusion and the second floating diffusion, has first luminance dynamic range of at least 90 dB. The second photodiode, in conjunction with the second floating diffusion, has a second luminance dynamic range of at least 30 dB, and the first luminance dynamic range and the second luminance dynamic range overlap at least in part.

Figure 2B:
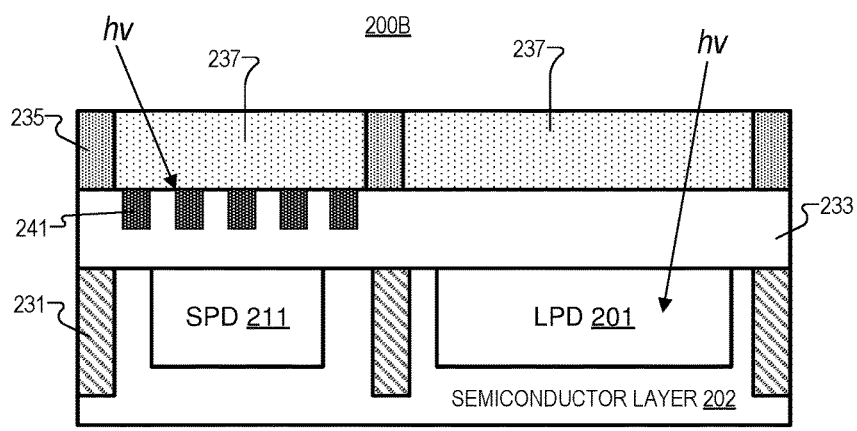
Figure 2C:
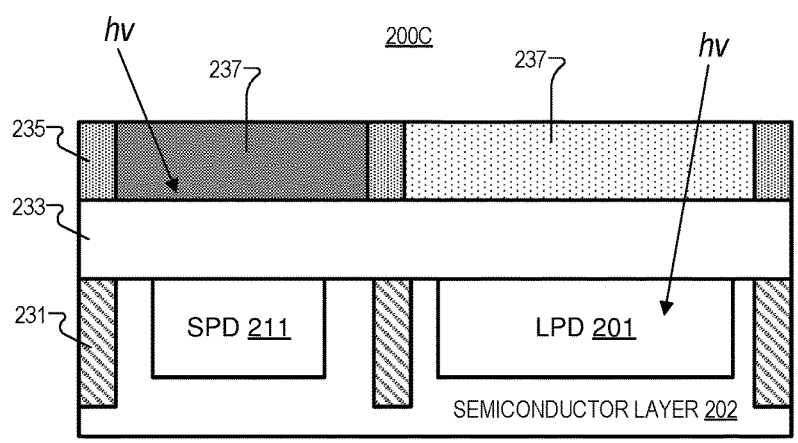

FIGS. 2A-2C illustrate various examples of attenuation layers for a small photodiode. The attenuation layer allows less light pass to the second photodiode than the first photodiode.

FIG. 2A illustrates one example of an image sensor pixel 200A, in accordance with the teachings of the present invention. Image sensor pixel 200A includes semiconductor layer 202, first (large) photodiode 201, second (small) photodiode 211, trench isolation structures 231, oxide material 233, color filter layer 237, optical isolation structures 235, and layer of semi-transparent material 243 (i.e. one example of an attenuation layer). As shown, layer of semi-transparent material 243 is disposed between color filter layer 237 and oxide material 233, and color filter layer 237 and oxide material 233 are disposed proximate to an illuminated side (side of semiconductor layer 202 that receives light hv) of single-exposure HDR image sensor 200A.

In the depicted example, individual photodiodes are at least in part surrounded by trench isolation structures 231, which may be filled with metal, semiconductor, or oxide materials. For example, trench isolation structures 231 may include a metal core, while the portion of the trench isolation structures 231 in contact with semiconductor layer 202 may include a high-k oxide or the like (e.g., hafnium oxide or silicon oxide). Thus, the high-k oxide is disposed between the metal center and semiconductor layer 202. Trench isolation structures 231 may be used to electrically and optically isolate the individual photodiodes, by reflecting light back into the photodiode, and preventing charge from traveling through, and on the surfaces of, semiconductor layer 202 into other photodiodes.

Similarly, optical isolation structures 235 may include a reflective material, such as a metal, which may reflect light into the proper photodiode and also separate different color filters from one another. As shown, layer of semi-transparent material 243 is optically aligned with second photodiode 211, so that it blocks or attenuates some of the incoming light into second photodiode 211. Moreover, semi-transparent material 243 is laterally coextensive with one section of optical isolation structures 235. In some examples, layer of semi-transparent material 243 may be a darkened polymer, an opaque polymer, or the like. As shown, layer of semi-transparent material 243 is disposed in oxide material 233; however, in other examples layer of semi-transparent material 243 may be disposed in the color filter layer or directly on the semiconductor layer 202, in accordance with the teachings of the present disclosure. In some examples, the amount of light reaching second photodiode 211 may be 20 times less than the light reaching first photodiode 201 because of semitransparent material 243.

In the depicted example, the smaller full well capacity of second photodiode 211 is achieved by constructing second photodiode 211 with a smaller volume active region than first photodiode 201. However, one of ordinary skill in the art having the benefit of the present disclosure will appreciate there are other ways to achieve a photodiode with a smaller full well capacity, in accordance with the teachings of the present disclosure.

FIG. 2B depicts one example of an image sensor pixel 200B, in accordance with the teachings of the present disclosure. As shown, image sensor pixel 200B is similar to the image sensor pixel 200A in FIG. 2A. But one major difference is that image sensor pixel 200B has a metal grid 241 to attenuate the amount of light reaching second photodiode 211. Metal grid 241 is optically aligned with second photodiode 211, and is disposed in oxide material 233. Moreover, metal grid 241 is laterally coextensive with one section of optical isolation structures 235. Metal grid 241 may have a periodicity such that it can be used as a notch filter for certain wavelengths of light. For example, if image sensor pixel 200B is only intended to absorb visible light metal grid may have a periodicity to block infrared light.

FIG. 2C depicts yet another example of an image sensor pixel 200C, in accordance with the teachings of the present invention. As shown image sensor pixel 200C is similar to the image sensor pixel 200B in FIG. 2B. However, one difference is that a darkened color filter is used to reduce the amount of light that enters second photodiode 211. For example, color filter layer 233 may be a polymer layer containing dye molecules. The darkened color filter may include a higher concentration of dye molecules than other similarly colored, or different colored, color filters in order to reduce the intensity of light incident on second photodiode 211.

It is appreciated that the techniques depicted in FIGS. 2A-2C may be combined in any suitable manner in accordance with the teachings of the present disclosure. For example, a darkened color filter may be used in conjunction with a metal grid to both achieve attenuation of image light and exclude a particular wavelength range from entering second photodiode 211.

Figure 3:
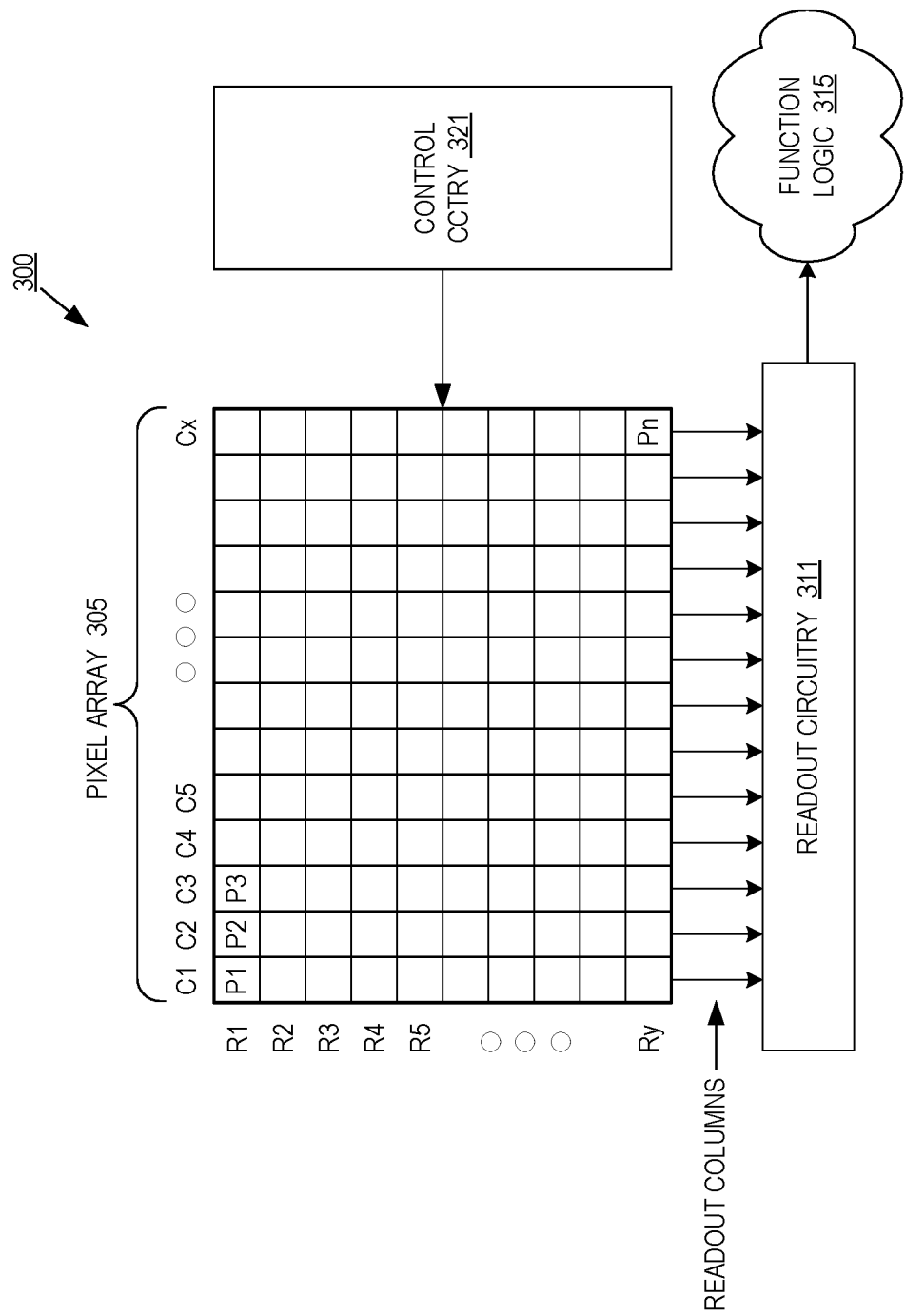
FIG. 3 is a block diagram illustrating one example of an imaging system which may include the image sensor of FIGS. 1A-2C, in accordance with the teachings of the present disclosure.

FIG. 3 is a block diagram illustrating one example of an imaging system which may include the image sensor pixels of FIGS. 1A-2C, in accordance with the teachings of the present invention. Imaging system 300 includes pixel array 305, control circuitry 321, readout circuitry 311, and function logic 315. In one example, pixel array 305 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 305 has acquired its image data or image charge, the image data is readout by readout circuitry 311 and then transferred to function logic 315. In various examples, readout circuitry 311 may include amplification circuitry, analog-to-digital conversion (ADC) circuitry, or otherwise. Function logic 315 may simply store the image data or even manipulate the image data by applying post image effects (e.g., autofocus, crop, rotate, remove red eye, adjust brightness, adjust contrast, or otherwise). In one example, readout circuitry 311 may readout a row of image data at a time along readout column lines (illustrated) or may readout the image data using a variety of other techniques (not illustrated), such as a serial readout or a full parallel readout of all pixels simultaneously.

In one example, control circuitry 321 is coupled to pixel array 305 to control operation of the plurality of photodiodes in pixel array 305. For example, control circuitry 321 may generate a shutter signal for controlling image acquisition. In the depicted example, the shutter signal is a global shutter signal for simultaneously enabling all pixels within pixel array 305 to simultaneously capture their respective image data during a single acquisition window. In another example, image acquisition is synchronized with lighting effects such as a flash.

In one example, imaging system 300 may be included in a digital camera, cell phone, laptop computer, automobile or the like. Additionally, imaging system 300 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 300, extract image data from imaging system 300, or manipulate image data supplied by imaging system 300.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A single-exposure high dynamic range (HDR) image sensor, comprising:
   a first photodiode disposed in a semiconductor material;
   a second photodiode, with a smaller full-well capacity than the first photodiode, disposed in the semiconductor material;
   a first floating diffusion disposed in the semiconductor material proximate to the first photodiode;
   a first transfer gate coupled to the first photodiode to transfer first image charge accumulated in the first photodiode into the first floating diffusion in response to a first transfer signal applied to the first transfer gate;
   a second floating diffusion disposed in the semiconductor material proximate to the second photodiode;
   a second transfer gate coupled to the second photodiode to transfer second image charge accumulated in the second photodiode into the second floating diffusion in response to a second transfer signal applied to the second transfer gate; and
   an attenuation layer disposed between the second photodiode and image light directed towards the single-exposure HDR image sensor to block a portion of the image light from reaching the second photodiode.

2. The single-exposure HDR image sensor of claim 1, wherein the second floating diffusion is coupled to a capacitor to store the first image charge transferred from the first photodiode.

3. The single-exposure HDR image sensor of claim 1, further comprising a dual floating diffusion gate disposed between the first floating diffusion and the second floating diffusion to transfer image charge from the second floating diffusion to the first floating diffusion in response to a transfer signal applied to the dual floating diffusion gate.

4. The single-exposure HDR image sensor of claim 1, further comprising an amplifier coupled to the first floating diffusion to amplify a charge on the first floating diffusion, and a row select transistor coupled to the amplifier.

5. The single-exposure HDR image sensor of claim 1, wherein the single-exposure HDR image sensor has a luminance dynamic range of at least 120 dB, wherein the first photodiode, in conjunction with the first floating diffusion and the second floating diffusion, has first luminance dynamic range of at least 90 dB, and wherein the second photodiode, in conjunction with the second floating diffusion, has a second luminance dynamic range of at least 30 dB, and wherein the first luminance dynamic range and the second luminance dynamic range overlap at least in part.

6. The single-exposure HDR image sensor of claim 1, further comprising a reset transistor coupled to first floating diffusion and the second floating diffusion to reset image charge in the first floating diffusion and the second floating diffusion.

7. The single-exposure HDR image sensor of claim 1, wherein the attenuation layer includes at least one of a metal grid, or a layer of semi-transparent material.

8. The single-exposure HDR image sensor of claim 7, wherein the at least one of the metal grid or the layer of semi-transparent material is disposed between a color filter layer and an oxide material, wherein the color filter layer and the oxide material are disposed proximate to an illuminated side of the single-exposure HDR image sensor.

9. The single-exposure HDR image sensor of claim 7, wherein the metal grid has a periodicity to block a specific wavelength of light.

10. The single-exposure HDR image sensor of claim 1, wherein the attenuation layer includes a darkened color filter, relative to other color filters having a same color, in a color filter layer disposed proximate to an illuminated side of the single-exposure HDR image sensor.

11. A high dynamic range (HDR) imaging system, comprising:
   a first photodiode disposed in a semiconductor material;
   a second photodiode, with a smaller full-well capacity than the first photodiode, disposed in the semiconductor material;
   a first floating diffusion disposed in the semiconductor material proximate to the first photodiode and coupled to receive first image charge from the first photodiode;
   a second floating diffusion disposed in the semiconductor material proximate to the second photodiode and coupled to receive second image charge from the second photodiode;
   an attenuation layer disposed between the second photodiode and image light directed towards the second photodiode to block a portion of the image light from reaching the second photodiode; and
   readout circuitry coupled to readout the first image charge from the first floating diffusion and readout the second image charge from the second floating diffusion.

12. The HDR imaging system of claim 11, further comprising:
   a first transfer gate coupled to the first photodiode to transfer first image charge accumulated in the first photodiode into the first floating diffusion in response to a first transfer signal applied to the first transfer gate; and
   a second transfer gate coupled to the second photodiode to transfer second image charge accumulated in second photodiode into the second floating diffusion in response to a second transfer signal applied to the second transfer gate.

13. The HDR imaging system of claim 11, wherein the attenuation layer includes at least one of:
   a metal grid;
   a layer of semi-transparent material; or
   a darkened color filter, relative to other color filters having a same color, in a color filter layer disposed proximate to an illuminated side of the single-exposure HDR image sensor.

14. The HDR imaging system of claim 13, wherein the at least one of the metal grid or the layer of semi-transparent material is disposed between the color filter layer and an oxide material, wherein the color filter layer and the oxide material are disposed proximate to an illuminated side of the single-exposure HDR image sensor.

15. The HDR imaging system of claim 14, wherein the metal grid has a periodicity to block a specific wavelength of light.

16. The HDR imaging system of claim 11, wherein the second floating diffusion is coupled to a capacitor to store the first image charge transferred from the first photodiode.

17. The HDR imaging system of claim 16, further comprising a dual floating diffusion gate disposed between the first floating diffusion and the second floating diffusion to transfer image charge from the second floating diffusion and the capacitor to the first floating diffusion in response to a transfer signal applied to the dual floating diffusion gate.

18. The HDR imaging system of claim 11, further comprising an amplifier coupled to the first floating diffusion to amplify a charge on the first floating diffusion, and a row select transistor coupled to the amplifier.

19. The HDR imaging system of claim 11, wherein the volume of an active region of the first photodiode is larger than a volume of an active region of the second photodiode.

20. The HDR imaging system of claim 11, wherein the HDR imaging system has a luminance dynamic range of at least 120 dB, wherein the first photodiode, in conjunction with the first floating diffusion and the second floating diffusion, has first luminance dynamic range of at least 90 dB, and wherein the second photodiode, in conjunction with the second floating diffusion, has a second luminance dynamic range of at least 30 dB, and wherein the first luminance dynamic range and the second luminance dynamic range overlap at least in part.

* * * * *